(12) United States Patent
Chen

(10) Patent No.: US 7,417,837 B2
(45) Date of Patent: Aug. 26, 2008

(54) ESD PROTECTION SYSTEM FOR MULTI-POWER DOMAIN CIRCUITRY

(75) Inventor: Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 221 days.

(21) Appl. No.: 11/256,287

(22) Filed: Oct. 21, 2005

(65) Prior Publication Data

US 2007/0091523 A1 Apr. 26, 2007

(51) Int. Cl.
*H02H 9/00* (2006.01)

(52) U.S. Cl. ......................................................... 361/56
(58) Field of Classification Search .................... 361/56
See application file for complete search history.

(56) References Cited

U.S. PATENT DOCUMENTS 5,973,534 A * 10/1999 Singh .......................... 327/309
6,069,782 A * 5/2000 Lien et al. .................... 361/111
6,693,469 B2 * 2/2004 Prodanov .................... 327/108
2006/0268474 A1 * 11/2006 Huang et al. ................. 361/56

OTHER PUBLICATIONS

Hirokazu Hayashi et al., ESD Protection Design Using a Mixed-Mode Simulation for Advanced Devices, ESD Association, EOS/ESD Symposium 04-125, pp. 2B.4.1-2B.4.7.

Eugene. Worley, "Distributed Gate ESD Network Architecture for Inter-Power Domain Signals", ESD Association, EOS/ESD Symposium 04-238, pp. 4B.1.1-4B.1.10.

* cited by examiner

*Primary Examiner*—Michael J Sherry
*Assistant Examiner*—Lucy Thomas
(74) *Attorney, Agent, or Firm*—K & L Gates LLP

(57) ABSTRACT

The present invention discloses an IC implemented with ESD protection system. In one embodiment, the includes a first device in a first power domain, and a second device in a second power domain. A buffer module is coupled between the first device and the second device for allowing a signal to pass across between the first and second devices during a normal operation, and for increasing an impedance between the first and second devices during an electrostatic discharge (ESD) event, thereby reducing a possibility of having an ESD current flow from the first device to the second device.

16 Claims, 5 Drawing Sheets

ESD PROTECTION SYSTEM FOR MULTI-POWER DOMAIN CIRCUITRY

BACKGROUND

The present invention relates generally to integrated circuit (IC) designs, and more particularly to an electrostatic discharge (ESD) protection system for multi-power domain circuitry.

A gate dielectric of a metal-oxide-semiconductor (MOS) transistor of an IC is very susceptible to damage. The gate dielectric may be destroyed by being contacted with a voltage only a few volts higher than a supply voltage of the IC. It is understood that a regular supply voltage is typically 5.0, 3.3 volts or even lower. Electrostatic voltages from common environmental sources can easily reach thousands, or even tens of thousands of volts. Such voltages are destructive even though the charge and any resulting current are extremely small. For this reason, it is of critical importance to discharge any static electric charge as it builds up, before it damages the IC.

An ESD protection circuit is typically added to an IC at its bond pads, which are the connections for the IC to outside circuitry. For example, in an operating IC, electric power is supplied to a VDD pad, electric ground is supplied to a VSS pad, electronic signals are supplied from outside to some pads, and electronic signals generated by the core circuitry of the IC are supplied to other pads for delivery to external circuits and devices. During the normal operation, the ESD protection circuit blocks a current to flow therethrough and is effectively isolated from the normally operating core circuitry. During an ESD event, the ESD protection circuit is designed to switch on quickly, thereby dissipating the ESD current to ground before its damages any logic components of the IC.

As the semiconductor processing technology advances, the gate dielectric of MOS transistor becomes thinner and increasingly susceptible to damage caused by the ESD current. This issue becomes more serious when the MOS transistor is used in a multi-power domain circuitry where a diode module is typically connected to an I/O ground bus between two power domains. When the ESD occurs, the diode module may induce the ESD current to flow through a damaging path other than the I/O ground bus as a desired path, thereby damaging the thin-gate-dielectric MOS transistors.

Therefore, it is desirable to design an ESD protection system for multi-power domain circuitry that allows the ESD current to dissipate through a predefined path.

SUMMARY

The present invention discloses an IC implemented with ESD protection system. In one embodiment, this includes a first device in a first power domain, and a second device in a second power domain. A buffer module is coupled between the first device and the second device for allowing a signal to pass across between the first and second devices during a normal operation, and for increasing an impedance between the first and second devices during an electrostatic discharge (ESD) event, thereby reducing a possibility of having an ESD current flow from the first device to the second device.

The construction and method of operation of the invention, however, together with additional objects and advantages thereof will be best understood from the following description of specific embodiments when read in connection with the accompanying drawings.

DESCRIPTION

Figure 1:
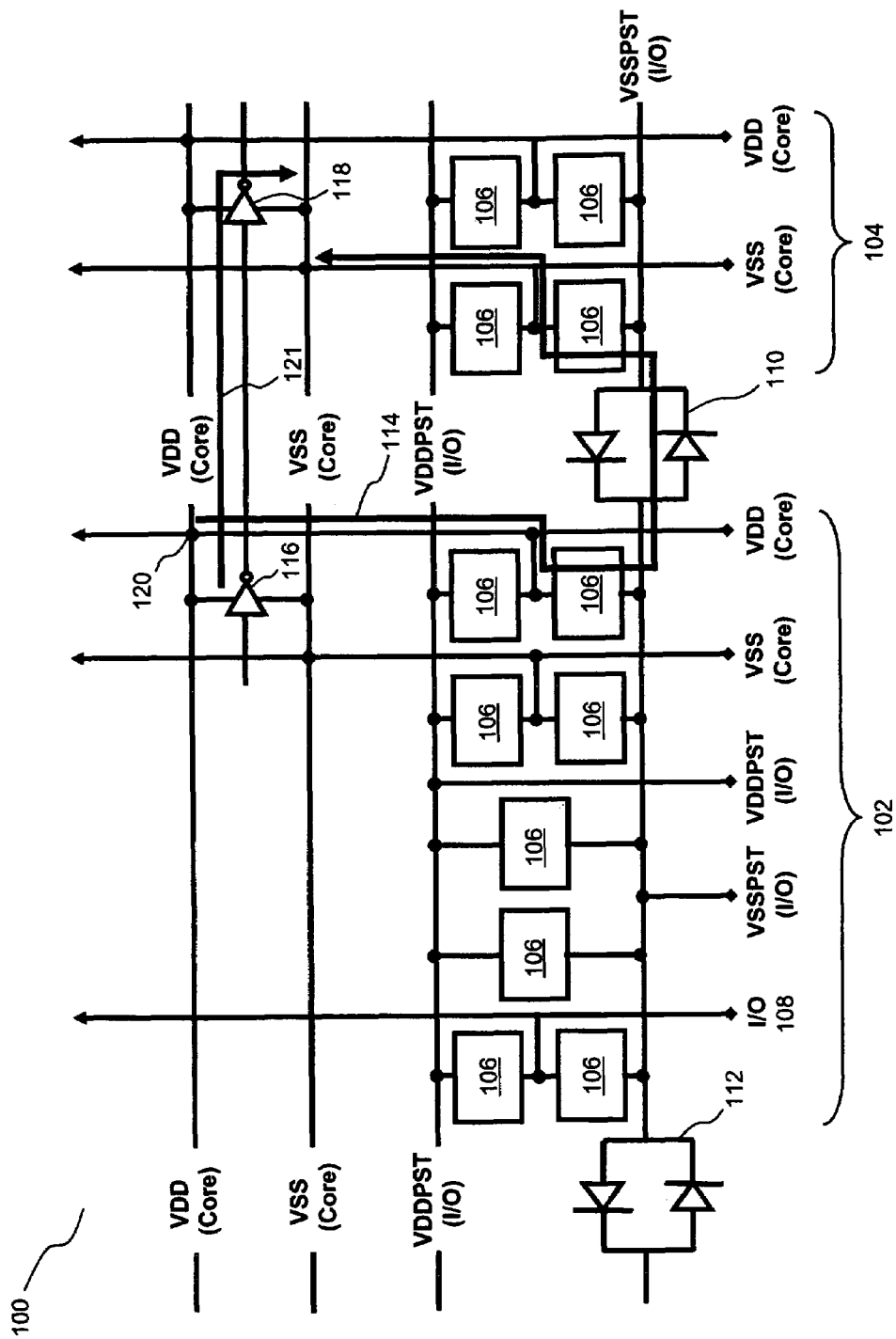
FIG. 1 illustrates a conventional multi-power domain ESD network.

FIG. 1 illustrates a conventional multi-power domain ESD protection system 100. As shown, the protection system 100 is designed to provide ESD protection for at least two power domains such as an I/O power domain 102 and a core power domain 104. All ESD charges at both domains are designed to be dissipated into an I/O ground bus VSSPST, which is used as a global ESD bus. Various ESD protection devices, such as 105, 106 and 107, are implemented between bus lines such as the I/O ground bus VSSPST, the I/O power supply bus VDDPST, and the I/O bus 108. A set of back-to-back diodes 110 is implemented on the I/O ground bus VSSPST at a boundary between the I/O power domain 102 and the core power domain 104 in order to isolate one another from simultaneous switching output (SSO) noise.

One drawback of the ESD protection system is its poor ESD protection performance for devices within a core circuit. This drawback becomes more serious with the presence of the back-to-back diodes, such as the diode sets 110 and 112. In an ESD event occurring at a node 120, the ESD current is supposed to dissipate to the core ground bus VSS in the core power domain 104 through a predefined current path 114. However, due to the presence of the back-to-back diodes 110, the ESD current may find its way to the core ground bus VSS from a PMOS transistor 121 of invert 116 in the I/O power domain 102 to an NMOS transistor 119 of inverter 118 in the core power domain 104 through an undesired current path 122. This can cause serious damage to the NMOS transistor 119. As the semiconductor processing technology advances, the gate dielectric of the NMOS transistor 119 becomes thinner and more susceptible to damage caused by the above-mentioned ESD phenomenon.

Figure 2:
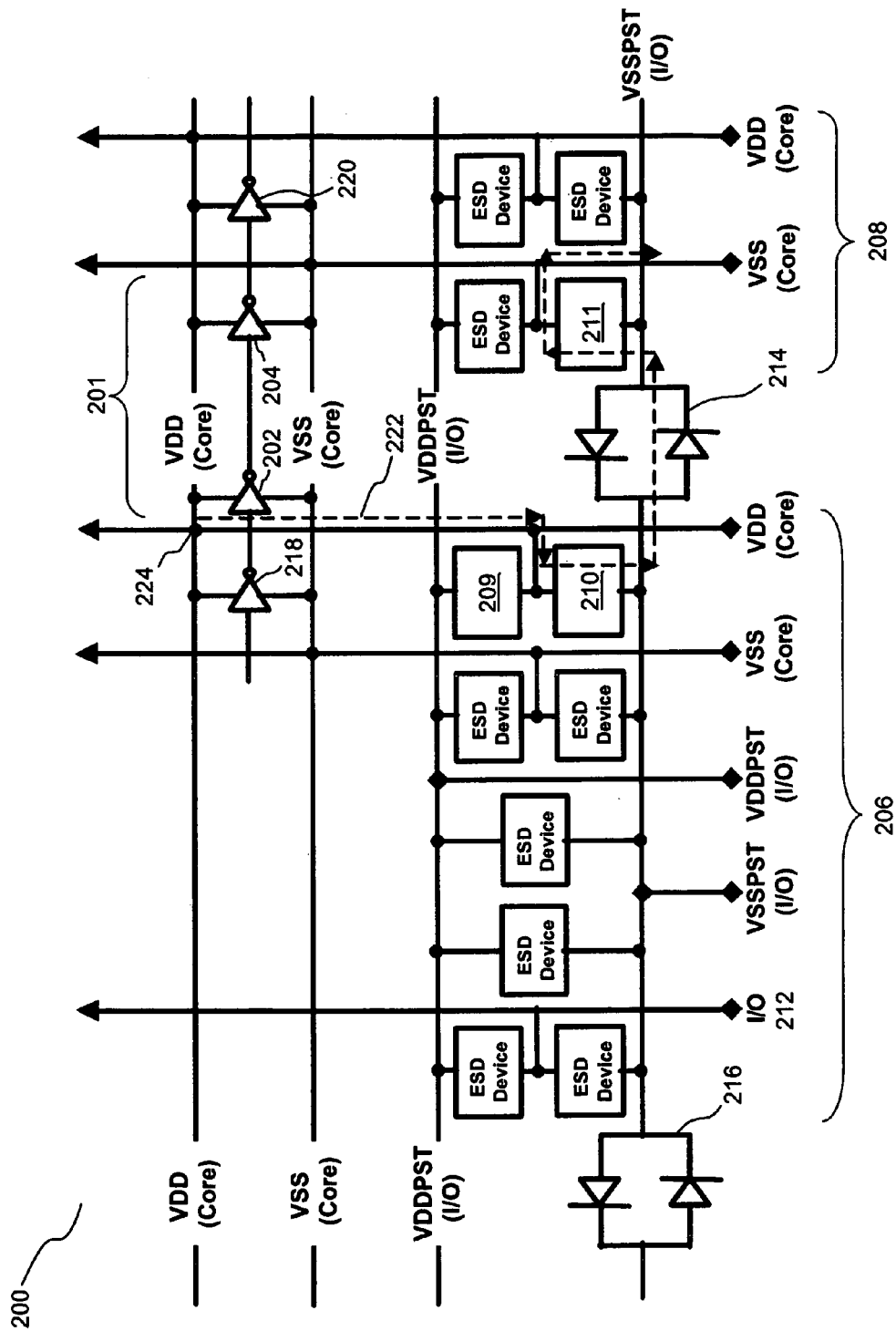
FIG. 2 illustrates an ESD protection system for multi-power domain circuitry in accordance with one embodiment of the present invention.

FIG. 2 illustrates a multi-power domain ESD protection system 200 implemented with a set of proposed cross-domain ESD buffers in accordance with one embodiment of the present invention. In this embodiment, the multi-power domain ESD protection system 200 is designed to provide ESD protection for at least two power domains, such as an I/O power domain 206 and a core power domain 208. It is understood by those skilled in the art that the principles of the multi-power domain ESD protection system 200 can also be applied to more than two power domains. To eliminate SSO noise between various domains, one or more sets of back-to-back diodes 214 and 216 are implemented between adjacent power-domains at the I/O ground bus VSSPST. For example, the set of back-to-back diodes 214 is implemented between the I/O power domain 206 and the core power domain 208 at the I/O ground bus VSSPST. A number of ESD protection devices are implemented between bus lines, such as the I/O ground bus VSSPST, a core supply bus VDD, a core ground bus VSS, a I/O supply bus VDDPST, and an I/O bus 212. For example, an ESD protection device 209 is implemented between the I/O supply bus VDDPST and the core supply bus VDD while another ESD protection device 210 is implemented between the core supply bus VDD and I/O ground bus VSSPST in the I/O power domain 206. As another example, an ESD protection device 211 is implemented between the core ground bus VSS and the I/O ground bus VSSPST in the core power domain 208. It is understood by those skilled in the art that the ESD protection device includes, but not being limited to a diode string, thick-field-oxide (TFO) clamp, grounded-gate NMOS (GGNMOS) transistor, silicon controlled rectifier (SCR), etc.

In a normal operation, the ESD protection devices 209, 210 and 211 remain at an off state to prevent current from flowing therethrough, thereby allowing the core circuit that they seek to protect functions normally. During an ESD event, the ESD protection devices are turned on for dissipating the ESD current through a predetermined ESD current path via the I/O ground bus VSSPST.

A buffer module 201 is implemented between a first device 218 in the I/O power domain 206 and a second device 220 in the core power domain. For illustrative purposes, the first and second devices 218 and 220 are shown as inverters. However, it is understood by those skilled in the art that they can be any devices, such as resistors, capacitors, diodes, and transistors, or other circuit modules. The buffer module 201 can be any circuit module that allows a signal to pass across between the first and second devices 218 and 220 during a normal operation, while increase an impedance therebetween during an electrostatic discharge (ESD) event. For illustrative purposes, the buffer module 201 is shown as circuit configured by a set of serially coupled inverters 202 and 204.

During an ESD event, since the buffer module 201 increases the impedance between the first and second devices 218 and 220, the possibility of having the ESD current dissipate through a predetermined ESD current path in stead of flowing through a harmful path between the first and second devices 218 and 220 is increased. For example, when an ESD occurs at a node 224, the ESD buffer would increase the impedance for the ESD current flowing from the first device 218 to the second device 220, and therefore urge the ESD current to flow via a predetermined current path 222 though the ESD protection device 210, the back-to-back diodes 214, and the ESD protection device 211 and dissipate via the core ground bus VSS. This protects the second device 220 from damage caused by the ESD current flowing through an undesired harmful path.

Figure 3:
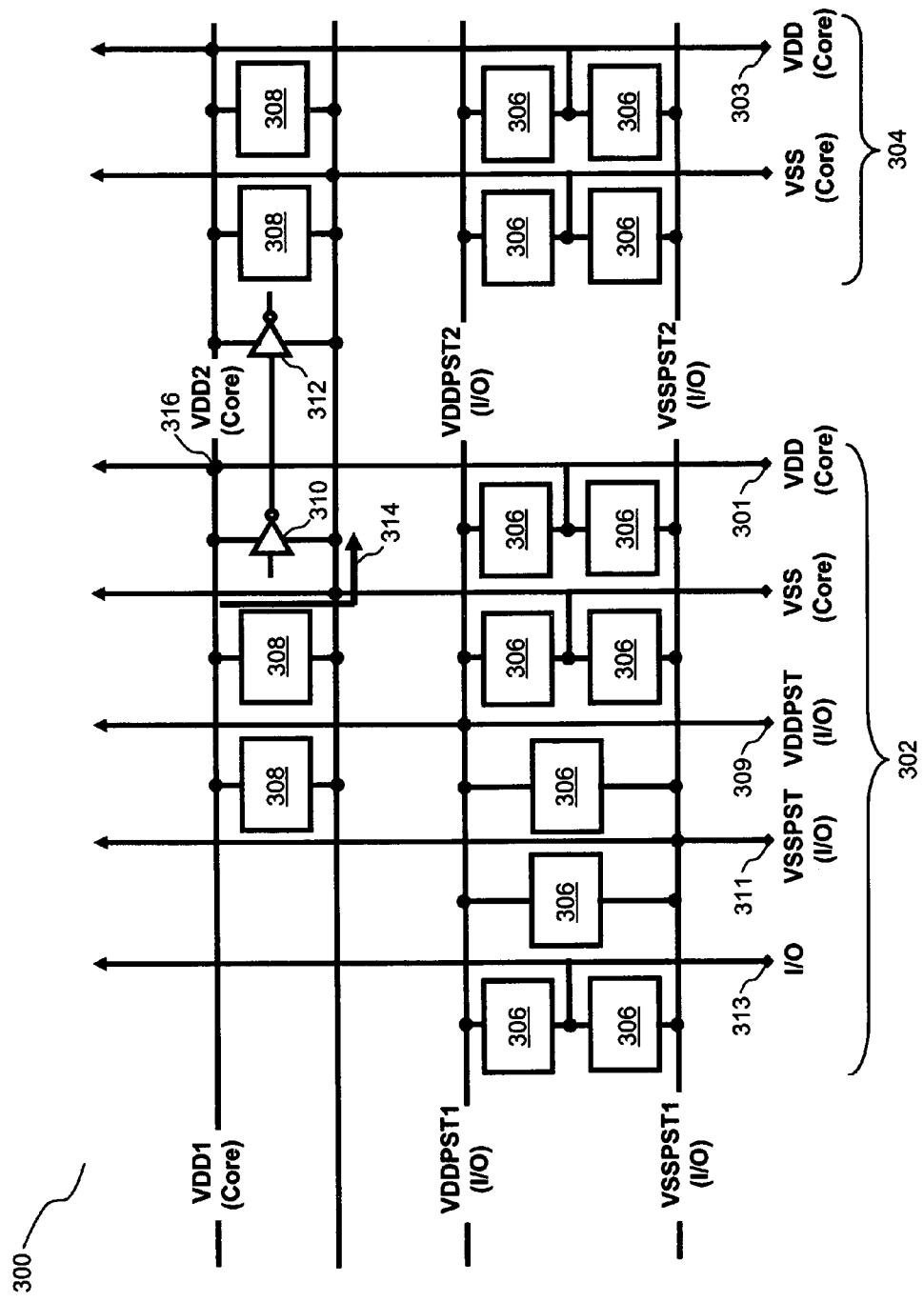
FIG. 3A illustrates a buffer module within the ESD protection system in accordance with on embodiment of the present invention.
FIG. 3B illustrates a buffer module within the ESD protection system in accordance with another embodiment of the present invention.
Figure 3A:
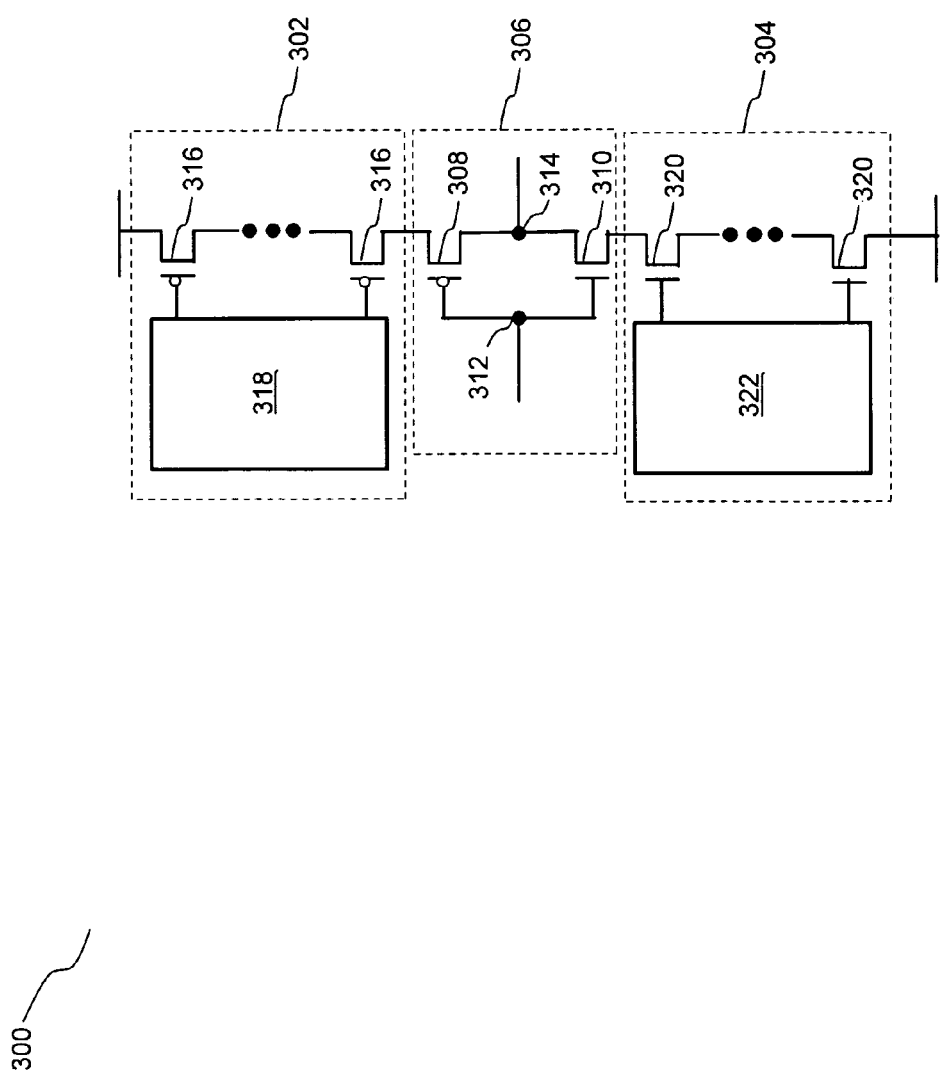

FIG. 3A partially illustrates a buffer module 300 in accordance with one embodiment of the present invention. The buffer module 300 includes a header module 302 and a footer module 304, both of which are coupled with a CMOS logic buffer device 306, which is essentially an inverter buffer that is configured by a PMOS transistor 308 and an NMOS transistor 310. The gates of the PMOS transistor 308 and the NMOS transistor 310 are tied together at a node 312 that is supplied with an input signal, while the drains of the PMOS transistor 308 and the NMOS transistor 310 are coupled together at a node 314 for providing an output signal. The header module 302, having one or more cascading header PMOS transistors 316 and a tie-low device 318, is implemented between a power supply voltage and the source of the PMOS transistor 308. The tie-low device 318 provides the gates of all cascading header PMOS transistors 316 with a logic-low signal. The footer module 304, having one or more cascading footer NMOS transistors 320 and a tie-high device 322, is implemented between the source of the NMOS transistor 310 and a complementary power supply voltage, such as ground. The tie-high device 322 provides the gates of all cascading NMOS transistors 320 with a logic-high signal.

The cascading header PMOS transistors 316 and footer NMOS transistors 320 within the header module 302 and the footer module 304 can increase the break down voltages of PMOS and NMOS transistors 308 and 310, respectively. The breakdown voltages of the PMOS and NMOS transistors 308 and 310 can be increased by increasing the numbers of the header PMOS transistors 316 and the footer NMOS transistors 320, respectively. As such, this can increase the ESD trigger-on voltage of the buffer module 300.

Figure 3B:
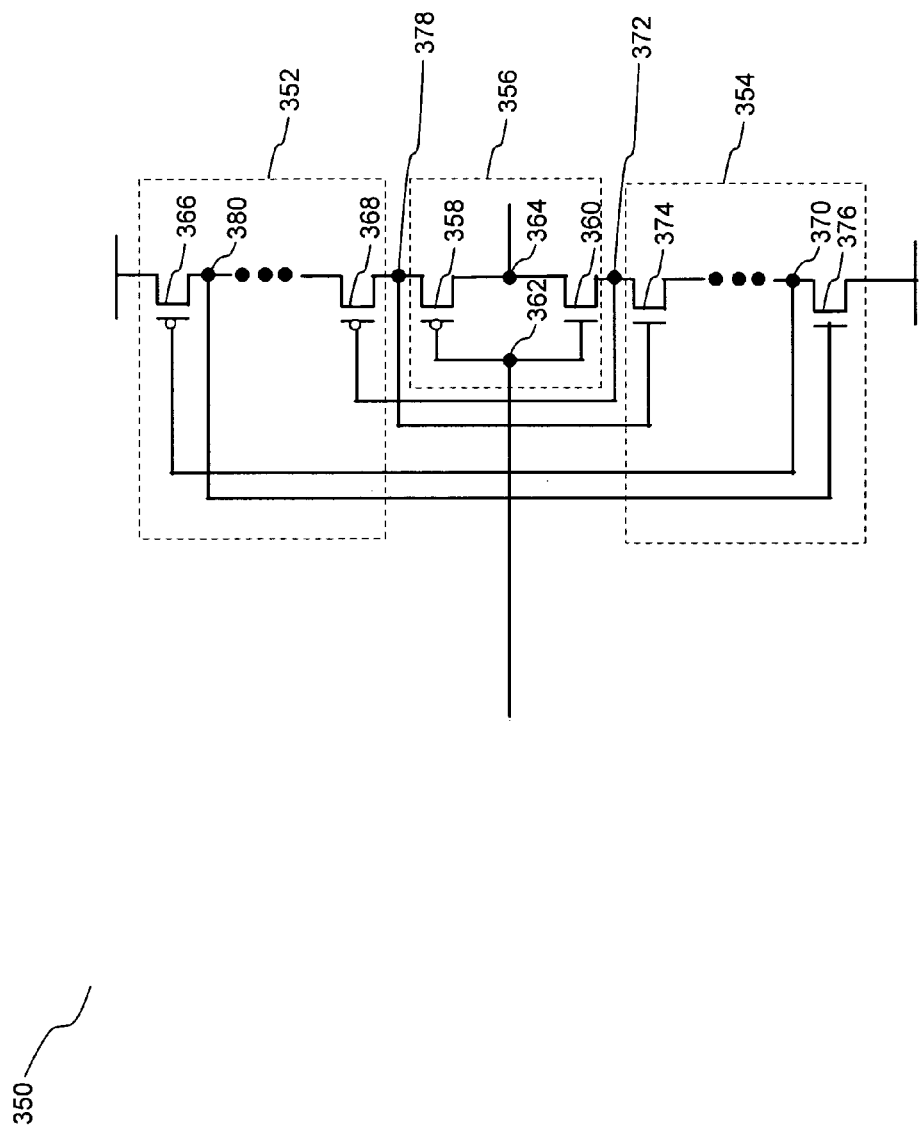

FIG. 3B illustrates another buffer module 350 in accordance with one embodiment of the present invention. The buffer module 350 includes a header module 352 and a footer module 354, both of which are coupled with a CMOS logic buffer device 356 in order to increase the trigger-on voltage of the buffer module used within a multi-power domain ESD protection system. As shown, the CMOS logic buffer device 356 is configured by a PMOS transistor 358 and an NMOS transistor 360. The gates of the PMOS transistor 358 and the NMOS transistor 360 are tied together at a node 362 that is supplied with an input signal, while the drains of the PMOS transistor 358 and the NMOS transistor 360 are coupled together at a node 364 as the output terminal of the buffer module 350. The header module 352, having one or more cascading header PMOS transistors such as 366 and 368, is implemented between a power supply voltage and the source of the PMOS transistor 358. The footer module 354, having one or more cascading footer NMOS transistors such as 374 and 376, is implemented between the source of the NMOS transistor 360 and a complementary power supply voltage, such as ground. The gate of the header PMOS transistor 366 is connected to a node 370, which is the drain of its symmetrically corresponding footer NMOS transistor 376. The gate of the header PMOS transistor 368 is coupled to a node 372, which is the drain of its symmetrically corresponding footer NMOS transistor 374. This eliminates the need for an additional tie-low device connecting to the gates of the header PMOS transistors 366 and 368. The gate of the footer NMOS transistor 374 is connected to a node 378, which is the drain of its symmetrically corresponding header PMOS transistor 368. The gate of the footer NMOS transistor 376 is coupled to a node 380, which is the drain of its symmetrically corresponding header PMOS transistor 366. This eliminates the need for an additional tie-high device connecting to the gates of the footer NMOS transistors 374 and 376.

The transistors 366, 368, 374 and 376 within the header module 352 and the footer module 354 can increase the break down voltage of the CMOS logic buffer device 356, thereby increasing the ESD trigger-on voltage of the buffer module 350. In addition, the breakdown voltages of the PMOS and NMOS transistors 358 and 360 can be increased by increasing the numbers of the header PMOS transistors such as 366 and 368, and the footer NMOS transistors such as 374 and 376, respectively.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims.

Accordingly, it is appropriate that the appended claims be construed broadly and in a manner consistent with the scope of the invention, as set forth in the following claims.

What is claimed is:

1. An integrated circuit comprising:
   a first device in a first power domain;
   a second device in a second power domain; and
   a buffer module coupled between the first device and the second device for allowing a signal to pass across between the first and second devices during a normal operation, and for increasing an impedance between the first and second devices during an electrostatic discharge (ESD) event, thereby reducing a possibility of having an ESD current flow from the first device to the second device, the buffer module comprising:
   at least one CMOS logic buffer device having a first PMOS transistor and a first NMOS transistor serially coupled to one another;
   one or more header PMOS transistors serially coupled between a power supply voltage and the first PMOS transistor for increasing a breakdown voltage of the first PMOS transistor during the ESD event, wherein a gate of the first PMOS transistor is not coupled to any gate of the header PMOS transistors regardless of an output voltage level of the CMOS logic buffer device, and gates of the one or more header PMOS transistors are coupled to a logic-low signal to increase an ESD trigger-on voltage of the buffer module.

2. The integrated circuit of claim 1 wherein the breakdown voltage of the first PMOS transistor is increased by increasing the number of the header PMOS transistors.

3. The integrated circuit of claim 2 wherein the buffer module further comprises a footer module coupled between the first NMOS transistor and a complementary power supply voltage for increasing a breakdown voltage of the first NMOS transistor during the ESD event.

4. The integrated circuit of claim 3 wherein the footer module comprises one or more footer NMOS transistors serially coupled between the complementary power supply voltage and the first NMOS transistor.

5. The integrated circuit of claim 4 wherein the breakdown voltage of the first NMOS transistor is increased by increasing the number of the footer NMOS transistors.

6. The integrated circuit of claim 5 comprising a tie-low device for providing the gates of the header PMOS transistors with a logic-low signal.

7. The integrated circuit of claim 6 wherein the footer module further comprises a tie-high device for providing the gates of the footer NMOS transistors with a logic-high signal.

8. The integrated circuit of claim 5 wherein the gates of the header PMOS transistors are connected to the drains of their symmetrically corresponding footer NMOS transistors, and the gates of the footer NMOS transistors are connected to the drains of their symmetrically corresponding header PMOS transistors.

9. An electrostatic discharge (ESD) protection system comprising:
   a first device in a first power domain;
   a second device in a second power domain;
   at least one CMOS logic buffer device having a first PMOS transistor and a first NMOS transistor coupled between the first and second device;
   a header module coupled between the first PMOS transistor and a power supply voltage for increasing a breakdown voltage of the first PMOS transistor during an electrostatic discharge (ESD) event; and
   a footer module coupled between the first NMOS transistor and a complementary power supply voltage for increasing a breakdown voltage of the first NMOS transistor during the ESD event,
   wherein the header module comprises one or more header PMOS transistors serially coupled between the power supply voltage and the first PMOS transistor, and gates of the one or more header PMOS transistors are coupled to a logic-low signal and gates of the one or more footer NMOS transistors are coupled to a logic-high signal to increase an ESD trigger-on voltage of the buffer module, and
   wherein a gate of the first PMOS transistor is not coupled to any gate of the header PMOS transistors regardless of an output voltage level of the CMOS logic buffer device.

10. The system of claim 9 wherein the footer module comprises one or more footer NMOS transistors serially coupled between the complementary power supply voltage and the first NMOS transistor.

11. The system of claim 10 wherein the breakdown voltages of the first PMOS and NMOS transistors are increased by increasing the numbers of the header PMOS and footer NMOS transistors, respectively.

12. The system of claim 11 wherein the header module further comprises a tie-low device for providing the gates of the header PMOS transistors with a logic-low signal, and the footer module further comprises a tie-high device for providing the gates of the footer NMOS transistors with a logic-high signal.

13. The system of claim 12 wherein the gates of the header PMOS transistors are connected to the drains of their symmetrically corresponding footer NMOS transistors, and the gates of the footer NMOS transistors are connected to the drains of their symmetrically corresponding header PMOS transistors.

14. An electrostatic discharge (ESD) protection system comprising:
   a first device in a first power domain;
   a second device in a second power domain;
   at least one CMOS logic buffer device having a first PMOS transistor and a first NMOS transistor coupled between the first and second device;
   one or more header PMOS transistors serially coupled between the first PMOS transistor and a power supply voltage for increasing a breakdown voltage of the first PMOS transistor during an electrostatic discharge (ESD) event; and
   one or more footer NMOS transistors serially coupled between the first NMOS transistor and a complementary power supply voltage for increasing a breakdown voltage of the first NMOS transistor during the ESD event, and
   wherein gates of the one or more header PMOS transistors are coupled to a logic-low signal and gates of the one or more footer NMOS transistors are coupled to a logic-high signal to increase an ESD trigger-on voltage of the buffer module, and
   wherein the breakdown voltages of the first PMOS and NMOS transistors are increased by increasing the numbers of the header PMOS and footer NMOS transistors, respectively, wherein a gate of the first PMOS transistor is not coupled to any gate of the header PMOS transistors regardless of an output voltage level of the CMOS logic buffer device.

15. The system of claim 14 further comprising a tie-low device for providing the gates of the header PMOS transistors with a logic-low signal, and a tie-high device for providing the gates of the footer NMOS transistors with a logic-high signal.

16. The system of claim 14 wherein the gates of the header PMOS transistors are connected to the drains of their symmetrically corresponding footer NMOS transistors, and the gates of the footer NMOS transistors are connected to the drains of their symmetrically corresponding header PMOS transistors.

* * * * *